(12) United States Patent
Ashouei et al.

(10) Patent No.: US 7,696,774 B2
(45) Date of Patent: Apr. 13, 2010

(54) SYSTEMS AND METHODS FOR PROVIDING DEFECT-TOLERANT LOGIC DEVICES

(76) Inventors: Maryam Ashouei, 855 W. Peachtree, Apt. 1533, Atlanta, GA (US) 30308-1181; Adit D. Singh, 459 Arnell La., Auburn, AL (US) 36830; Abhijit Chatterjee, 2267 Orleans Ave., Marietta, GA (US) 30062

( * ) Notice: Subject to any disclaimer, the term of this patent is extended or adjusted under 35 U.S.C. 154(b) by 0 days.

(21) Appl. No.: 12/123,972

(22) Filed: May 20, 2008

(65) Prior Publication Data

US 2009/0289657 A1    Nov. 26, 2009

(51) Int. Cl.
*H03K 19/003* (2006.01)
(52) U.S. Cl. .................................. 326/13; 714/724
(58) Field of Classification Search .................. 326/13; 714/724
See application file for complete search history.

(56) References Cited

U.S. PATENT DOCUMENTS 6,219,808 B1 *   4/2001   Sengoku ..................... 714/724
2002/0087927 A1 *   7/2002   Felber et al. ................. 714/724

* cited by examiner

*Primary Examiner*—Jean B Jeanglaude
(74) *Attorney, Agent, or Firm*—Troutman Sanders LLP; Ryan A. Schneider, Esq.; Trenton A. Ward, Esq.

(57) ABSTRACT

The present invention describes systems and methods to provide defect-tolerant logic devices. An exemplary embodiment of the present invention provides a defect-tolerant logic device including a plurality of CMOS gates and at least one defective CMOS gate included within the plurality of CMOS gates. Additionally, the at least one defective CMOS gate is enabled to be reconfigured into a pseudo-NMOS transistor if a P-network of the at least one defective CMOS gate is diagnosed as defective. Furthermore, the at least one defective CMOS gate is enabled to be reconfigured into a pseudo-PMOS transistor if the N-network of the at least one defective CMOS gate is diagnosed as defective.

20 Claims, 7 Drawing Sheets

SYSTEMS AND METHODS FOR PROVIDING DEFECT-TOLERANT LOGIC DEVICES

FIELD OF THE INVENTION

The present invention relates generally to systems and methods for defect-tolerant logic architectures and, more particularly, to systems and methods for providing defect-tolerant logic devices.

BACKGROUND OF THE INVENTION

Moore's Law posits that the number of transistors that can be inexpensively placed on an integrated circuit increases exponentially over time, doubling approximately every two years. Moore's Law was based upon an observation made by Intel co-founder Gordon E. Moore in a 1965 publication. This theory has held true for almost half a century of transistor technology development. State of the art semiconductor designers and manufacturers, however, are encountering more and more obstacles, as the device dimensions get smaller. As designers attempt to insert greater capacity into tiny structures, many issues arise with respect to timing, power, signal integrity, leakage current, thermal gradients and reliability problems (like electromigration).

Designers have attempted to combat the issues resulting from increasing densities by relying upon design-for-manufacturing (DFM) techniques and restricted design rules (RDRs). DFM and RDR techniques can help to obtain adequate yields for some nanometer scale implementations. As the scale of the transistor decreases, however, DFM and RDR techniques become relatively ineffective. More particularly, DRM and RDR techniques are not capable, in smaller nanometer scale logic implementations, of addressing problems relating to electromigration, hot carrier degradation, thin and vulnerable gate oxides, unpredicted process variations, and undetected manufacturing defects.

Conventional development cycles for logic devices, such as next generation processors, typically require multiple iterations of design, layout, fabrication, and post-processing design to achieve an acceptable yield for a given logic device. Typically, the initial fabrication runs for a new logic device design, especially when designing at a smaller geometry, will yield around 5% to 10% of functioning devices. Significant work must then be done to alter the design, layout, and manufacture of the logic device to remove defects from the design and the fabrication process and increase the yield percentage. Often times, the iterative redesign process is lengthy and expensive, sometimes lasting longer and consuming more resources than the initial design cycle. If the yield percentage for a particular new logic device design cannot be improved to approximately 60% to 80% of functioning product, then the design will have to abandoned.

At the current scale of the transistor, it has been possible to rely on iterative post-processing design to improve the yield for logic device fabrication to an acceptable level. Furthermore, as the scale of the transistor decreases, the iterative process of improving yield through redesign and fabrication modifications will no longer be a viable solution. Therefore, the success of nano-scale and smaller logic devices will depend upon their ability to provide some level of defect-tolerance. Conventionally, defect-tolerant logic architectures have been restricted to very high-end implementations. For example, some prior art systems have relied on triple modular redundancy ("TMR") to provide defect-tolerance. TMR is a defect-tolerant form of N-modular redundancy in which three systems perform a process and the results are processed by a voting system to produce a single output. If any one of the three systems fails, the other two systems can correct and mask the defect. If the voter system fails then the complete system will fail. Therefore, most TMR systems must ensure that the voter system is much more reliable than the other TMR components. While TMR can provide defect-tolerance in some applications, it is a very expensive technology because it requires a 200% or more increase in overhead for a logic device design. Additionally, TMR does not provide a viable means by which to overcome defects during manufacture.

Other prior art systems have proposed the use of a combination of system-level checking, component-level defect diagnosis, and spare-part reconfiguration. In these conventional defect-tolerant systems, the logic device relies upon buffer checker units to detect errors in functional incorrectness and then reconfigures the circuits of the logic device to rely upon spare parts included in the device to replace the function of defective components. These conventional defect-tolerant systems are largely inefficient and ineffective because of the significant amount of overhead required to support the system-level checking functions and the overhead required to include a sufficient set of spare parts for reconfiguration. In many logic device implementations, each circuit is unique; thus, such conventional defect-tolerant systems would need to have a spare part for every part in the device. For the majority of implementations, this level of overhead is simply not feasible.

Therefore, it would be advantageous to provide an apparatus and method for efficiently and effectively providing defect-tolerant logic devices.

Additionally, it would be advantageous to provide an apparatus and method to provide a defect-tolerant logic device with a low overhead.

Additionally, it would be advantageous to provide an improved system and method for correcting a defective transistor.

BRIEF SUMMARY OF THE INVENTION

The present invention describes systems and methods to provide defect-tolerant logic devices. An exemplary embodiment of the present invention provides a defect-tolerant logic device including a plurality of CMOS gates and at least one defective CMOS gate included within the plurality of CMOS gates. Additionally, the at least one defective CMOS gate is enabled to be reconfigured into a pseudo-NMOS transistor if a P-network of the at least one defective CMOS gate is diagnosed as defective. Furthermore, the at least one defective CMOS gate is enabled to be reconfigured into a pseudo-PMOS transistor if the N-network of the at least one defective CMOS gate is diagnosed as defective.

In addition to defect-tolerant logic devices, the present invention provides methods for correcting defective logic devices. An exemplary embodiment of a method for correcting a defective logic device includes the step of receiving a diagnosis of at least one defective CMOS gate among a plurality of CMOS gates of a logic device. Furthermore, the method for correcting a defective logic device includes the step of reconfiguring the at least one defective CMOS gate to a pseudo-NMOS transistor if a P-network of the at least one defective CMOS gate is diagnosed as defective. Similarly, the method for correcting a defective logic device includes the step of reconfiguring the at least one defective CMOS gate to a pseudo-PMOS transistor if the N-network of the at least one defective CMOS gate is diagnosed as defective.

These and other objects, features and advantages of the present invention will become more apparent upon reading the following specification in conjunction with the accompanying drawing figures.

DETAILED DESCRIPTION OF PREFERRED EMBODIMENTS

The present invention addresses the deficiencies in the prior art concerning the inability of logic devices to be defect-tolerant. Significantly, the present invention provides methods and apparatus for providing efficient and effective defect-tolerant logic devices. A defect-tolerant logic device provided in accordance with the present invention is enabled to overcome one or more defects in the Complimentary Metal Oxide Semiconductor ("CMOS") gates of the device by reconfiguring those defective CMOS gates. Additionally, the present invention overcomes the drawbacks of the conventional methods and systems in the prior art and provides systems and methods enabled to iteratively reconfigure portions of a logic device that may or may not be defective.

In an exemplary embodiment, the present invention provides a defect tolerant logic device including a plurality of CMOS gates and at least one defective CMOS gate included within the plurality of CMOS gates. Additionally, the at least one defective CMOS gate is enabled to be reconfigured into a pseudo-NMOS transistor if a P-network of the at least one defective CMOS gate is diagnosed as defective. Furthermore, the at least one defective CMOS gate is enabled to be reconfigured into a pseudo-PMOS transistor if the N-network of the at least one defective CMOS gate is diagnosed as defective.

In addition to defect-tolerant logic devices, the present invention provides methods for correcting defective logic devices. The term device is used herein to describe a circuit, system, component, collection of components, piece of equipment, instrument, network, part, set of parts, apparatus, appliance, contraption, contrivance, or other thing made for a particular purpose. An exemplary embodiment of a method for correcting a defective logic device includes the step of receiving a diagnosis of at least one defective CMOS gate among a plurality of CMOS gates of a logic device. Furthermore, the method for correcting a defective logic device includes the step of reconfiguring the at least one defective CMOS gate to a pseudo-NMOS transistor if a P-network of the at least one defective CMOS gate is diagnosed as defective. Similarly, the method for correcting a defective logic device includes the step of reconfiguring the at least one defective CMOS gate to a pseudo-PMOS transistor if the N-network of the at least one defective CMOS gate is diagnosed as defective.

Figure 1:
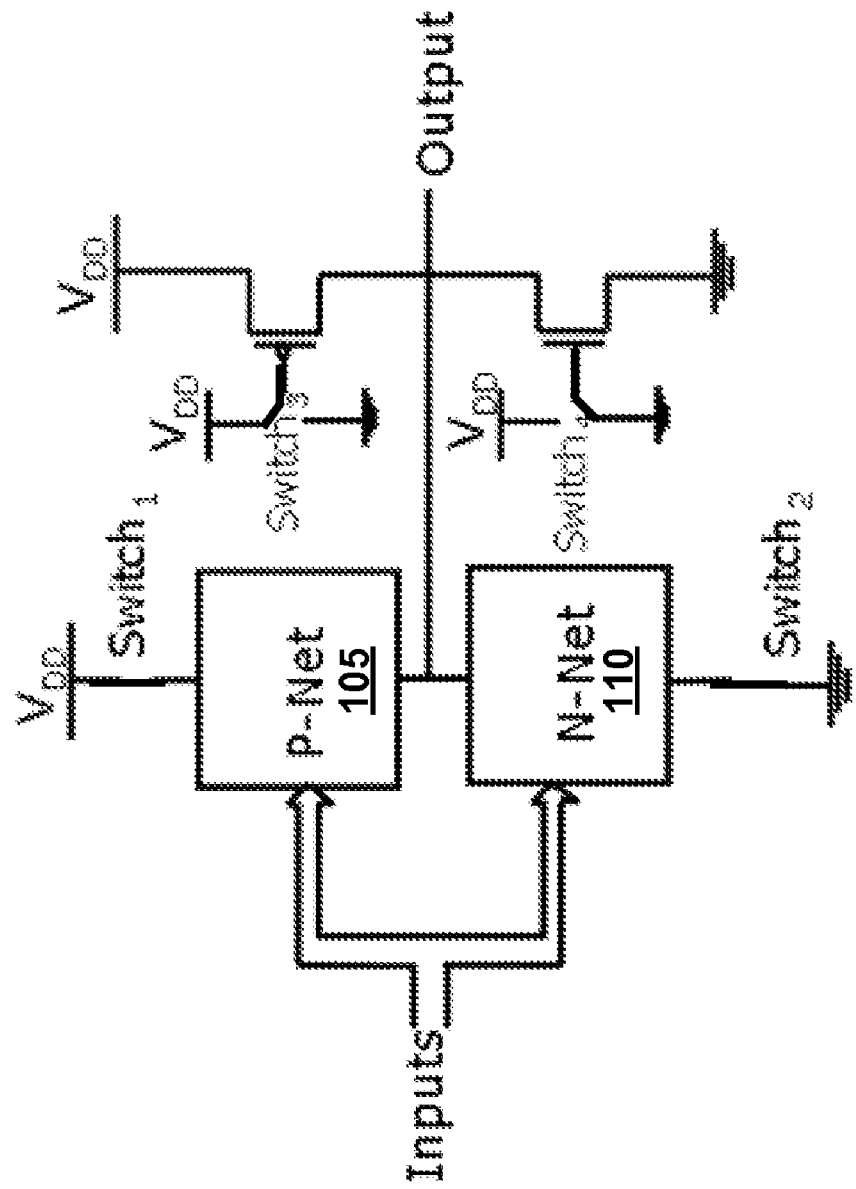
FIG. 1 provides an illustration of a defect-tolerant CMOS gate 100 in accordance with an exemplary embodiment of the present invention.

FIG. 1 provides an illustration of a defect-tolerant CMOS gate 100 in accordance with an exemplary embodiment of the present invention. As shown in the exemplary embodiment of FIG. 1, the defect-tolerant CMOS gate 100 can include P-network 105 and an N-network 110. In an exemplary embodiment, the P-network 105 and N-network 110 can be equivalent to those found in a conventional CMOS logic gate structure.

In an exemplary embodiment of the defect-tolerant CMOS gate 100, a defect-free CMOS gate 100 can operate in the same manner as a conventional CMOS gate. During the normal operation of the defect-tolerant CMOS gate 100 in an exemplary embodiment, switch1 is connected to the power supply (VDD) and switch2 is connected to ground (GND). In this exemplary embodiment, switch3 can connect the gate of the pull-up transistor to the VDD to turn it off. Furthermore, in this exemplary embodiment, switch4 can connect the gate of the pull-down transistor to the GND to turn it off.

Figure 2:
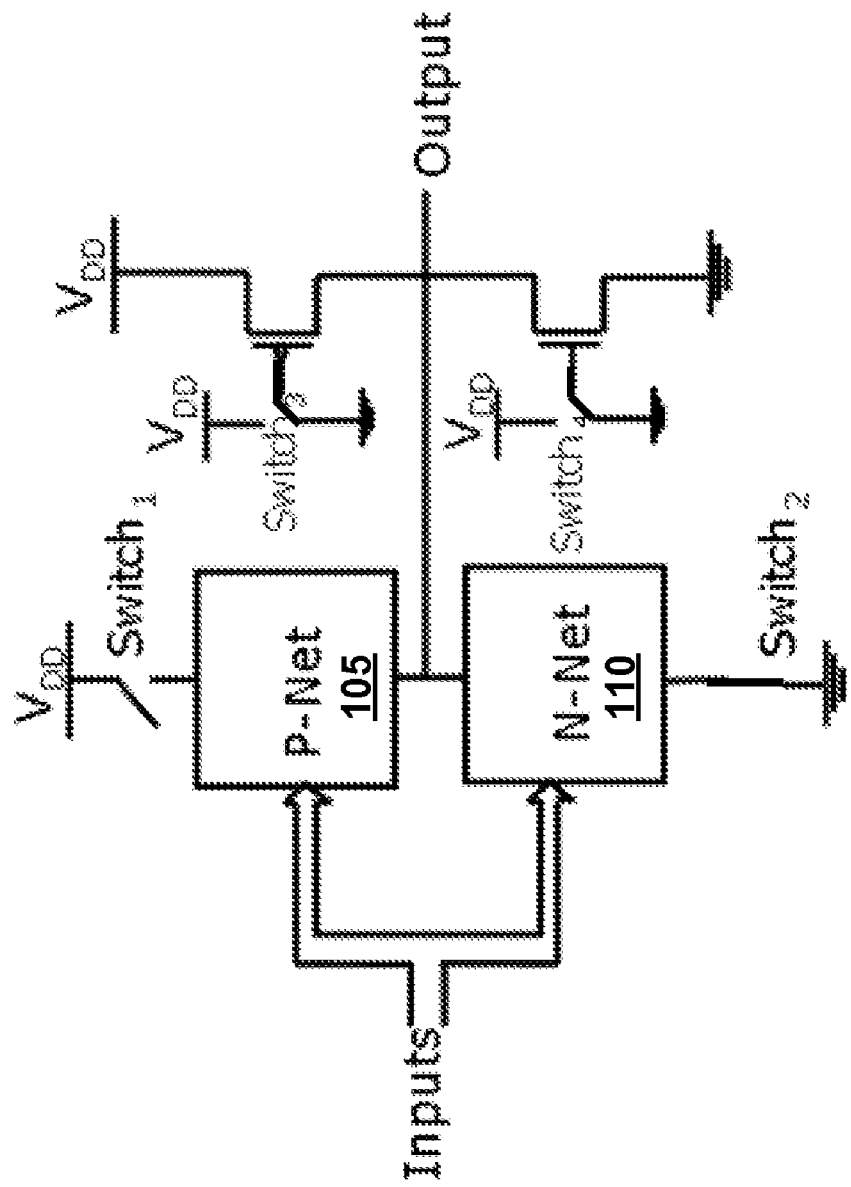
FIG. 2 provides an illustration of a defect-tolerant CMOS gate 100 in accordance with an exemplary embodiment of the present invention, in which the defect-tolerant CMOS gate 100 has been reconfigured to correct a defect in the P-network 105.

FIG. 2 provides an illustration of a defect-tolerant CMOS gate 100 in accordance with an exemplary embodiment of the present invention, in which the defect-tolerant CMOS gate 100 has been reconfigured to correct a defect in the P-network 105. In accordance with an exemplary embodiment of the defect-tolerant CMOS gate 100, the CMOS gate 100 can be reconfigured if a defect is detected or diagnosed in the CMOS gate 100. In the exemplary embodiment shown in FIG. 2, the defect-tolerant CMOS gate 100 can be reconfigured to compensate for a defect in the P-network 105 of the CMOS gate 100. In accordance with an exemplary embodiment of the present invention, the defect-tolerant CMOS gate 100 can be reconfigured by turning off switch1 to disconnect the defective P-network 105 from the power supply VDD, and switch3 can connect the gate of pull-up transistor to the GND. Therefore, in an exemplary embodiment, the defect-tolerant CMOS gate 100 can be converted to a pseudo-N-type Metal Oxide Semiconductor ("pseudo-NMOS") transistor. In the pseudo-NMOS configuration of the defect-tolerant CMOS gate 100, the defective P-network 105 is essentially converted into a pull-up transistor. The term pseudo-NMOS is used herein to describe a CMOS gate that has been reconfigured such that the P-network of the CMOS gate acts as a pull-up transistor. In this exemplary embodiment, the pseudo-NMOS configuration of the defect-tolerant CMOS gate 100 enables switch2 and switch4 to remain the same as in normal operation.

Figure 3:
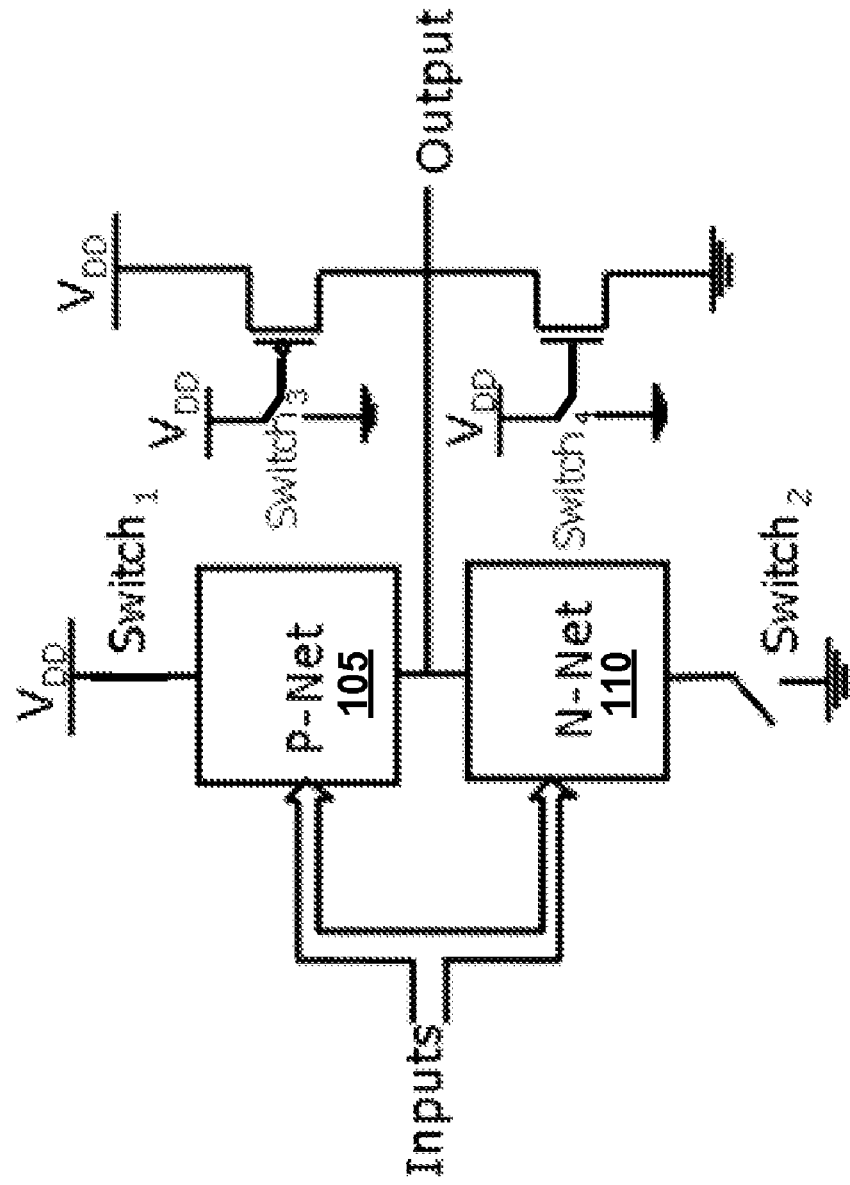
FIG. 3 provides an illustration of a defect-tolerant CMOS gate 100 in accordance with an exemplary embodiment of the present invention, in which the defect-tolerant CMOS gate 100 has been reconfigured to correct a defect in the N-network 110.

FIG. 3 provides an illustration of a defect-tolerant CMOS gate 100 in accordance with an exemplary embodiment of the present invention, in which the defect-tolerant CMOS gate 100 has been reconfigured to correct a defect in the N-network 110. Similar, to correcting defects in the P-network, an exemplary embodiment of the present invention can correct defects in the N-network. In an exemplary embodiment, a defect is diagnosed in the N-network 110 of the defect-tolerant CMOS gate 100. In accordance with an exemplary embodiment of the present invention, the defect-tolerant CMOS gate 100 can be reconfigured by turning off switch2 to disconnect the defective N-network 110 from GND and switch4 can connect the transistor to VDD. Therefore, the defect-tolerant CMOS gate 100 can be converted, in an exemplary embodiment, to a pseudo-P-type Metal Oxide Semiconductor ("pseudo-PMOS") transistor. In the pseudo-PMOS configuration of the defect-tolerant CMOS gate 100, the defective N-network 110 is essentially converted into a pull-down transistor. The term pseudo-PMOS is used herein to describe a CMOS gate that has been reconfigured such that the N-network of the CMOS gate acts as a pull-down transistor. In this exemplary embodiment, the pseudo-PMOS configuration of the defect-tolerant CMOS gate 100 enables switch1 and switch3 to remain the same as in normal operation.

One of the many significant benefits provided by an exemplary embodiment of defect-tolerant CMOS gate 100 in accordance with the present invention, is that it enables defect-tolerance in a logic device with a relatively minimal amount of overhead. Significantly, an exemplary embodiment of the defect-tolerant CMOS gate 100 is enabled to rely upon the inherent functional redundancy in static CMOS. The term "complementary" in Complimentary Metal Oxide Semiconductor refers to the fact that the typical digital design style with CMOS uses complementary and symmetrical pairs of P-type and N-type Metal Oxide Semiconductors ("MOS") for logic functions. Therefore, in a conventional CMOS gate, the function is implemented twice, once by a P-transistor network and once by an N-transistor network. An exemplary embodiment of the defect-tolerant CMOS gate 100 relies upon the inherent redundant structure of the CMOS gate to enable defect correction capability with low overhead. As each CMOS gate has both a network of P-type MOS transistors and a network of N-type MOS transistors, a defect can be corrected in the defect-tolerant CMOS gate 100 by disabling the defective transistor and relying on the second transistor to provide the functional operation for the gate.

Those of skill in the art will appreciate that the defect-tolerant CMOS gate 100 is only effective when the defect is isolated to either P-network or the N-network. If the defect is present in both the P-network and the N-network of one individual defect-tolerant CMOS gate 100, then the CMOS gate 100 will not be able to be reconfigured. Those of skill in the art will appreciate that this is because one of the transistors must work properly after reconfiguration in order for the function of the CMOS gate to be salvaged. Those of skill in the art will appreciate that the majority of the CMOS gate defects are typically isolated to only one network of the CMOS gate, whether they arise in manufacture or in field use. Thus, a majority of the defects that are diagnosed in exemplary embodiments of the defect-tolerant CMOS gates 100 can be corrected.

As the methods of correcting a defective logic device enabled by the present invention rely upon the inherent redundancy of the CMOS gate, the overhead associated with configuring a device for defect correction in accordance with an exemplary embodiment of the present invention is relatively low. The method of correcting a defective logic device involves reconfiguring an existing defect-tolerant CMOS gate 100 into a pseudo-NMOS gate or a pseudo-PMOS gate, depending upon whether the P-network or the N-network contains the defect.

In accordance with an exemplary embodiment of the present invention, a defect-tolerant logic device can be constructed from one or more defect-tolerant CMOS gates 100. More particularly, multiple defect-tolerant CMOS gates 100 can be used to create the circuits of an exemplary embodiment of a defect-tolerant logic device. Additionally, reconfiguration control signals can be transmitted by the exemplary embodiment of the defect-tolerant logic device to reconfigure those defect-tolerant CMOS gates 100 that are diagnosed as defective. The architecture of the defect-tolerant logic device can be configured such that reconfiguration control signals can be delivered to the defect-tolerant CMOS gates 100 in a variety of different ways. For example, in exemplary embodiment, the architecture of the defect-tolerant logic device includes multiple reconfiguration traces make up a reconfiguration control grid. Those of skill in the art will appreciate that various other architectures for such reconfiguration traces could be relied upon to interconnect the defect-tolerant CMOS gates 100 of a defect-tolerant logic device for reconfiguration.

Figure 4:
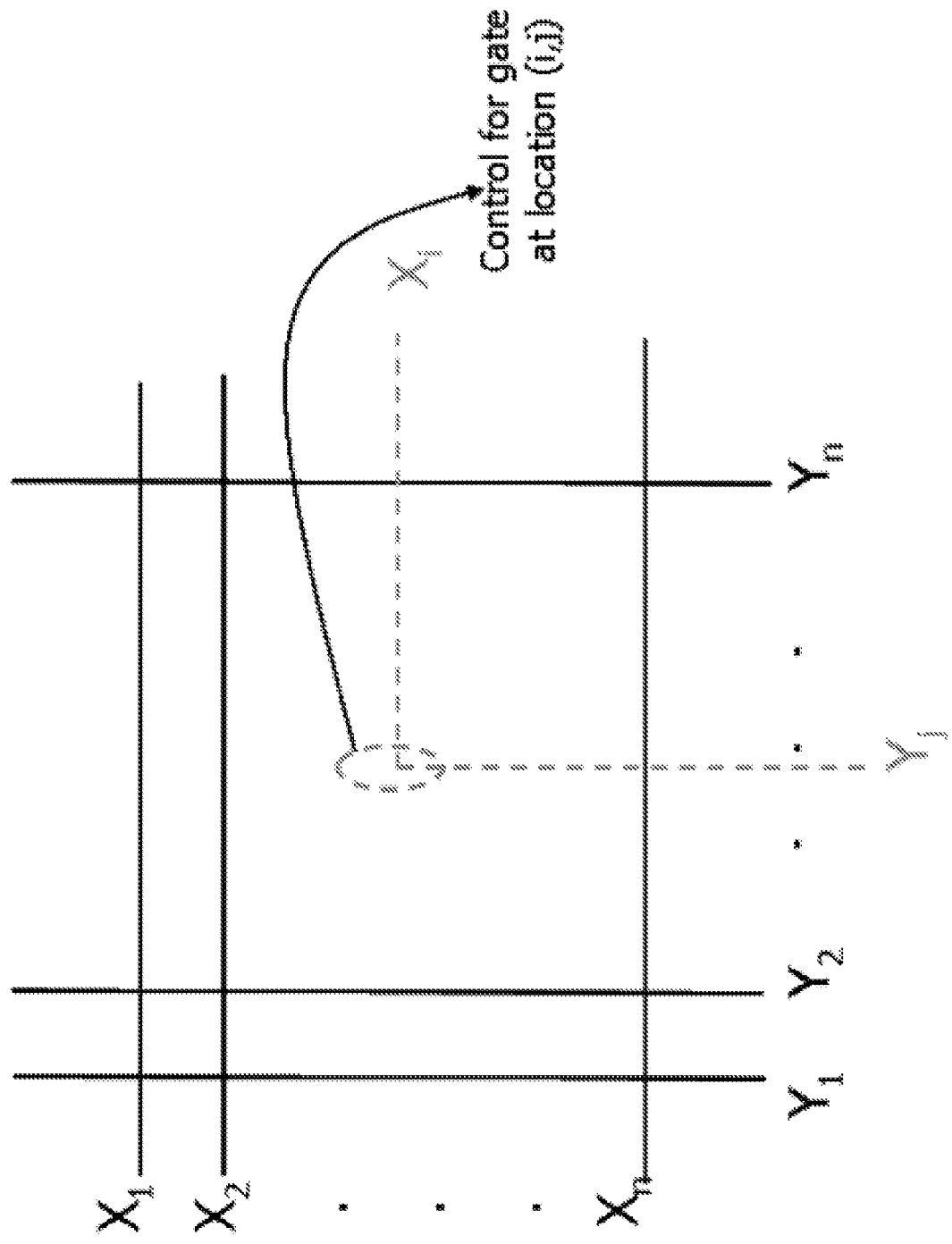
FIG. 4 provides an illustration of a reconfiguration control grid 405 architecture for a defect-tolerant logic device in accordance with an exemplary embodiment of the present invention.

FIG. 4 provides an illustration of a reconfiguration control grid 405 architecture for a defect-tolerant logic device in accordance with an exemplary embodiment of the present invention. As shown in FIG. 4, the reconfiguration control grid 405 can be a grid-based two-dimensional reconfiguration architecture comprised of X and Y control signals. In the reconfiguration control grid 405 depicted in FIG. 4, control signals $X_i$ and $Y_j$ address the standard cell located at (i,j) in the two-dimensional array of standard defect-tolerant CMOS gates 100. The reconfiguration control grid 405 architecture shown in the exemplary embodiment in FIG. 4 is a simplified architecture in which it is assumed that each of cells is the same size and that each row has the same number of cells. Those of skill in the art will appreciate, however, that an alternative embodiment of the reconfiguration control grid 405 could be configured to apply to architectures with varying cell sizes and row sizes. For example, and not limitation, an alternative embodiment of the reconfiguration control grid 405 could extend to cells with different sizes by designing the grid based on the smallest quantized cell size. In this embodiment, the larger cells can be assigned multiple column addresses; thus a cell twice as wide as the basic cell in any row would have two column control signals routed through it, either one of which can be used to address it.

In an exemplary embodiment of the defect-tolerant logic device, the reconfiguration control signal contains both grid location information and N-network or P-network information. For example, and not limitation, the reconfiguration control grid 405 can include $X_i$ and $Y_j$ grid control signals corresponding to the location of a defective defect-tolerant CMOS gate 100 and at least one bit of additional information indicating whether the P-network or the N-network of the gate 100 is defective. One significant advantage of the grid-based two-dimensional reconfiguration control grid is that it reduces the routing overhead from n to $n^{0.5}$.

The reconfiguration traces for the reconfiguration control grid can be provided in the logic device in a variety of suitable manners. In an exemplary embodiment, the reconfiguration traces can be fabricated in the polysilicon layer of the layout of the defect-tolerant logic device. Those of skill in the art will appreciate that there can be minimal switching performance constraints on the reconfiguration control signals, as they are not signals that switch during normal operation. Therefore, the reconfiguration traces can be laid out in the polysilicon layer in an exemplary embodiment of the defect-tolerant logic device, even though the polysilicon layer is too slow for most functional interconnects in logic devices. Similar to the use of a fixed pitch metal rail for routing power and ground signals in conventional logic devices, the horizontal and vertical polysilicon reconfiguration traces in an exemplary embodiment of the defect-tolerant logic device can be used to layout the reconfiguration control grid. Furthermore, the reconfiguration traces in an exemplary embodiment can include short metal (or diffusion) "jumper" connections to allow crossover.

Implementing the reconfiguration traces in the polysilicon layer of an exemplary embodiment of the defect-tolerant logic device permits the reconfiguration control signals to be implemented with virtually no adverse impact on the availability of the metal layers for use for the functional interconnects. In fact, an exemplary embodiment of the defect-tolerant logic device providing a reconfiguration control grid in the polysilicon layer can assist in ensuring an even trace distribution in each mask layer to guarantee the planarity. In certain advanced processes, some of the process layers can be checked for trace density and unused areas filled with dummy traces to ensure proper planarization by chemical mechanical polishing ("CMP"). An exemplary embodiment of the reconfiguration control grid can be designed to assist in ensuring proper planarization for the polysilicon layer.

In an exemplary embodiment, the method of fabrication of the defect-tolerant logic device can conveniently provide the reconfiguration control grid in the polysilicon layer for an arrangement of the defect-tolerant CMOS gates 100 during the placement step in physical design. Such an embodiment would allow routing to be performed by the metal layers with minimal constraints. Conventional placement and routing tools can be used in the manufacture of certain exemplary embodiments of the defect-tolerant logic device without special modification for the defect-tolerance capability.

In an exemplary embodiment of the defect-tolerant logic device, the reconfiguration control grid constitutes the majority of the overhead associated with defect-tolerant architecture. Wiring a reconfiguration control grid is a relatively minor cost associated with the significant defect-tolerance enabled by the exemplary embodiments of the present invention, when compared to the defect-tolerant architectures of the prior art. Prior art defect-tolerance architectures often involve implementing an entirely separate redundant gate. Therefore, the design overhead associated with such prior art defect-tolerance techniques can be double that of the non-defect-tolerant standard architecture.

While the methods and systems of defect-tolerance provided by the present invention are incredibly advantageous, enabling for the reconfiguration of a defective defect-tolerant CMOS gate 100 does result in certain costs. Primarily, an exemplary embodiment of the defective defect-tolerant CMOS gate 100 imposes additional delay and power dissipation. The added delay and power consumption are entirely negligible, however, when compared to the increase in yield enabled by the reconfiguration capability of an exemplary embodiment of the defect-tolerant logic device.

In the exemplary embodiment depicted in FIG. 1, for example and not limitation, the reconfiguration control grid can include inserting switch1 to enable the P-network 105 to be disconnected from the power supply VDD and switch2 to enable the N-network 110 to be disconnected from GND. In an exemplary embodiment, delay is added to the operation of the defect-tolerant CMOS gate 100 during normal operation due to the extra resistance contributed by switch1 and switch2 along with the extra junction capacitance contributed by the two pull-up and pull-down transistors. If the defect-tolerant CMOS gate 100 is defect free and operated normally, the amount of delay added is relatively low. The delay increases, however, when the defect-tolerant CMOS gate 100 is reconfigured to correct a defect in either the P-network 105 or the N-network 110.

One of the significant benefits of the defect-tolerant logic device provided in accordance with an exemplary embodiment of the present invention, is that the design of the defect-tolerant logic device can be configured such that defect-tolerant CMOS gates are only utilized in the critical areas of the logic device. For example, and not limitation, an exemplary embodiment of the defect-tolerant logic device can be a processor configured such that control logic from processor is made up of defect-tolerant CMOS gates, while the arithmetic logic for the processor is made up of conventional CMOS gates. In this exemplary embodiment, the arithmetic logic, made up of conventional CMOS gates, can still provide functional operation for a majority of implementations even though it may contain a number of defective gates, while the control logic of the processor can be reconfigured to be defect-free by relying upon the capabilities of the defect-tolerant CMOS gates 100. By configuring only the critical portions of a logic device with defect-tolerant CMOS gates 100, the delay overhead and leakage overhead penalties associated with such defect-tolerant CMOS gates 100 can be minimized. Those of skill in the art will appreciate that the ability to configure only the critical circuits of a logic device with defect-tolerant CMOS gates 100 can be advantageous not only to processor designs, but to a variety of different logic device designs.

Table 1 below provides results from testing a NAND2 circuit in a defect-tolerant logic device and a NOR2 circuit in a defect-tolerant logic device in accordance with exemplary embodiments of the present invention. The exemplary embodiments of the defect-tolerant logic devices containing the NAND2 and NOR2 circuits tested in Table 1 were constructed using exemplary embodiments of defect-tolerant CMOS gates 100. The NAND2 circuit and the NOR2 circuits were tested for delay overhead and power consumption or leakage overhead. The data provided in Table 1 illustrates the delay overhead encountered during normal operation of the defect-tolerant CMOS gate 100 ("No Defect"), after reconfiguration from a P-Network 105 defect ("P-Net Defective"), and after reconfiguration from an N-network 110 defect ("N-Net Defective"). Similarly, the data provided in Table 1 illustrates the leakage overhead encountered during normal operation of the defect-tolerant CMOS gate 100 ("No Defect"), after reconfiguration from a P-Network 105 defect ("P-Net Defective"), and after reconfiguration from an N-network 110 defect ("N-Net Defective").

TABLE 1

Delay and Leakage Overhead

| | Delay Overhead | | | Leakage Overhead | | |
|---|---|---|---|---|---|---|
| Gate Type | No Defect | P-net Defective | N-net Defective | No Defect | P-net Defective | N-net Defective |
| NAND2 | 7.4% | 37% | 27% | 12% | 120 X | 135 X |
| NOR 2 | 5.9% | 3.8% | 43% | 14.5% | 145 X | 155 X |

The overhead values provided in Table 1 were computed by comparing the circuits created with exemplary embodiments of the defect-tolerant CMOS gates 100 to conventional CMOS gate based circuits. As shown in Table, 1, the exemplary embodiment of NAND2 circuit configured with defect-tolerant CMOS gates 100 exhibits an increase in delay during normal operation of 7.4% in comparison to a conventional non-defect-tolerant CMOS gate constructed NAND2 circuit. Also, as shown in Table 1, the exemplary embodiment of NOR2 circuit configured with defect-tolerant CMOS gates 100 exhibits an increase in delay of 5.9% in comparison to a conventional NOR2 circuit constructed from non-defect-tolerant CMOS gates. Thus, as shown in Table 1, the increase in delay for an exemplary embodiment of the defect-tolerant CMOS gate 100 in normal operation is largely negligible, i.e. less than 8%. Table 1, illustrates the increase in delay that occurs when an exemplary embodiment of a defect-tolerant CMOS gate 100 is reconfigured. For example, Table 1 provides, that once a defective P-network 105 of the exemplary embodiment of NAND2 circuit configured with defect-tolerant CMOS gates 100 has been reconfigured into a pull-up network, the delay for the NAND2 circuit increases by 37% in comparison to a conventional non-defect-tolerant CMOS gate constructed NAND2 circuit. Reconfiguration of an exemplary embodiment of NAND2 circuit to correct a defective N-network 110 results in a slightly smaller delay increase of 27%.

Those of skill in the art will appreciate that the increase in delay of a particular circuit after reconfiguration can vary greatly depending on the defect corrected and the type of circuit. For example and not limitation, the correction of a defect in the P-network 105 of a NOR2 circuit results in significantly less delay increase than the reconfiguration of P-network 105 in a NAND2 circuit. Table 1 provides, that once a defective P-network 105 of the exemplary embodiment of NOR2 circuit configured with defect-tolerant CMOS gates 100 has been reconfigured into a pull-up network, the delay for the NOR2 circuit increases by only 3.8% in comparison to a conventional non-defect-tolerant CMOS gate constructed NOR2 circuit. Reconfiguration of an exemplary embodiment of NOR2 circuit to correct a defective N-network 110 results in a delay increase of 43%. Therefore, while the correction of a P-network 105 defect decreases the delay in an exemplary embodiment of a NOR2 circuit, the increase in delay for the correction of an N-network 110 defect is larger than that of an exemplary embodiment of a NAND2 circuit.

Table 1 also provides data illustrating the power dissipation characteristics for a NAND2 circuit and a NOR2 circuit constructed using exemplary embodiments of defect-tolerant CMOS gates 100. As provided in Table 1, the exemplary embodiment of NAND2 circuit configured with defect-tolerant CMOS gates 100 exhibits an increase in power dissipation or leakage during normal operation of 12% in comparison to a conventional non-defect-tolerant CMOS gate constructed NAND2 circuit. Furthermore, as provided in Table 1, the exemplary embodiment of the NOR2 circuit configured with defect-tolerant CMOS gates 100 exhibits an increase in power dissipation or leakage during normal operation of 14.5% in comparison to a conventional non-defect-tolerant CMOS gate constructed NOR2 circuit. Therefore, the increase in leakage associated with an exemplary embodiment of the defect-tolerant CMOS gate 100 is fairly insignificant during normal operation, i.e. less than 15%. The increase in leakage for the NAND2 and NOR2 circuits tested for Table 1 is much more significant once the circuits have been reconfigured to correct a defect. For example, and not limitation, the leakage for the NAND2 circuit constructed using exemplary embodiments of defect-tolerant CMOS gates 100 increases by a factor of 120 ("120×") after correction of a defect in the P-network 105 and 135× after the correction of a defect in the N-network 110. As shown in Table 1, the leakage for the NOR2 circuit constructed using exemplary embodiments of defect-tolerant CMOS gates 100 increases 145× after correction of a defect in the P-network 105 and 155× after the correction of a defect in the N-network 110.

Therefore, a fairly significant increase in power dissipation occurs for the exemplary embodiment tested in Table 1 when the defect-tolerant CMOS gate 100 is reconfigured as a pseudo-NMOS or pseudo-PMOS in the presence of a defect. This increase in leakage is largely due to the fact that the pseudo-NMOS gates and pseudo-PMOS gates, unlike standard CMOS gates, dissipate power in steady state.

Those of skill in the art will appreciate that the relationship between delay and leakage for a defect-tolerant logic device configured in accordance with an exemplary embodiment of the present invention is inversely proportional; thus, design choices can be made to achieve desired characteristics for either delay or leakage.

For example, and not limitation, in the design of an exemplary embodiment of a defect-tolerant logic device that places a higher priority on reducing power dissipation than reducing delay, the leakage overhead could be reduced by using higher threshold-voltage ("$V_t$") pull-up/pull-down transistors. Table 2 below provides results from testing a NAND2 circuit in a defect-tolerant logic device and a NOR2 circuit in exemplary embodiment of a defect-tolerant logic device using higher-$V_t$ pull-up/pull-down transistors.

TABLE 2

Delay and Leakage Overhead

| Gate Type | Delay Overhead | | | Leakage Overhead | | |
|---|---|---|---|---|---|---|
| | No Defect | P-net Defective | N-net Defective | No Defect | P-net Defective | N-net Defective |
| NAND2 | 7.4% | 52% | 48% | 7% | 94 X | 110 X |
| NOR 2 | 5.9% | 16% | 61% | 9% | 113 X | 128 X |

A comparison the second columns from Table 1 and Table 2 illustrates that the use of the higher-$V_t$ pull-up/pull-down transistors in the exemplary embodiment of a defect-tolerant logic device tested for Table 2 does not increase the delay in absence of defects (The NAND2 No Defect delay remained at 7.4% and the NOR2 No Defect delay remained at 5.9%). Therefore, in absence of defects, the exemplary embodiment of a defect-tolerant logic device using higher-$V_t$ pull-up/pull-down transistors does not increase the delay. The leakage overhead does significantly decrease in operation in the absence of defects. For example, Table 2 provides that the leakage overhead for the NAND2 circuit in the exemplary embodiment of a defect-tolerant logic device using higher-$V_t$ pull-up/pull-down transistors operating in no Defect mode decreases from 12% for the circuit tested in Table 1 to 7% for the circuit tested in Table 2. Additionally, Table 2 provides that the leakage overhead for the NOR2 circuit in the exemplary embodiment of a defect-tolerant logic device using higher-$V_t$ pull-up/pull-down transistors decreases from 14.5% for the circuit tested in Table 1 to 9% for the circuit tested in Table 2.

As shown in Table 2, the design of the exemplary embodiment of the defect-tolerant logic device with higher-$V_t$ pull-up/pull-down transistors significantly decreases the leakage overhead in defect mode, but also increases the delay overhead in defect mode. For example, Table 2 provides that the leakage overhead for the NAND2 circuit in the exemplary embodiment of a defect-tolerant logic device using higher-$V_t$ pull-up/pull-down transistors, in which a defect in the P-network has been repaired, decreases from 120× for the circuit tested in Table 1 to a 94× for the circuit tested in Table 2. Additionally, Table 2 provides that the leakage overhead for the NOR2 circuit in the exemplary embodiment of a defect-tolerant logic device using higher-$V_t$ pull-up/pull-down transistors, in which a defect in the P-network has been repaired, decreases from 145× for the circuit tested in Table 1 to 113× for the circuit tested in Table 2. Table 2 provides that the leakage overhead for the NAND2 circuit, in which a defect in the N-network has been repaired, decreases from 135× for the circuit tested in Table 1 to a 110× for the circuit tested in Table 2. Additionally, Table 2 provides that the leakage overhead for the NOR2 circuit, in which a defect in the N-network has been repaired, decreases from 155× for the circuit tested in Table 1 to 128× for the circuit tested in Table 2.

While Table 2 illustrates that the leakage overhead is reduced, it also illustrates that the delay overhead is increased for the circuits tested in Table 1 compared to the circuits tested in Table 2. For example, the delay overhead for the NAND2 circuit, in which a defect in the P-network has been repaired, increased from 37% for the circuit tested in Table 1 to 52% for the circuit tested in Table 2. The delay overhead for the NOR2 circuit, in which a defect in the P-network has been repaired, increased from 3.8% for the circuit tested in Table 1 to 16% for the circuit tested in Table 2. As illustrated with the exemplary embodiment of the defect-tolerant logic device tested for Table 2, certain design choices can be made in configuring the defect-tolerant logic device to give priority to either delay overhead or leakage overhead.

As illustrated by Table 2, the leakage overhead encountered with a defect-tolerant CMOS gate 100 operating in either pseudo-NMOS mode or pseudo-PMOS mode is relatively large, on the order of 100× increase. While this may appear to be a significant increase, the increase in power dissipation is only with respect to one reconfigured defect-tolerant CMOS gate 100. Therefore, those of skill in art will appreciate if only a small amount of the total number of CMOS gates for a defect-tolerant logic device are reconfigured, then the overall increase in the power dissipation for the defect-tolerant logic device will be negligible. For example, and not limitation, if 0.1% of cells are defective and reconfigured, then with the assumption of 100× leakage increase in either pseudo-PMOS or pseudo-NMOS mode, then overall leakage for the defect-tolerant logic device will increase by less than 10%. Thus, leakage overhead is relatively minimal when the leakage increase caused by the few defective cells is amortized across the entire defect-tolerant logic device.

Figure 5:
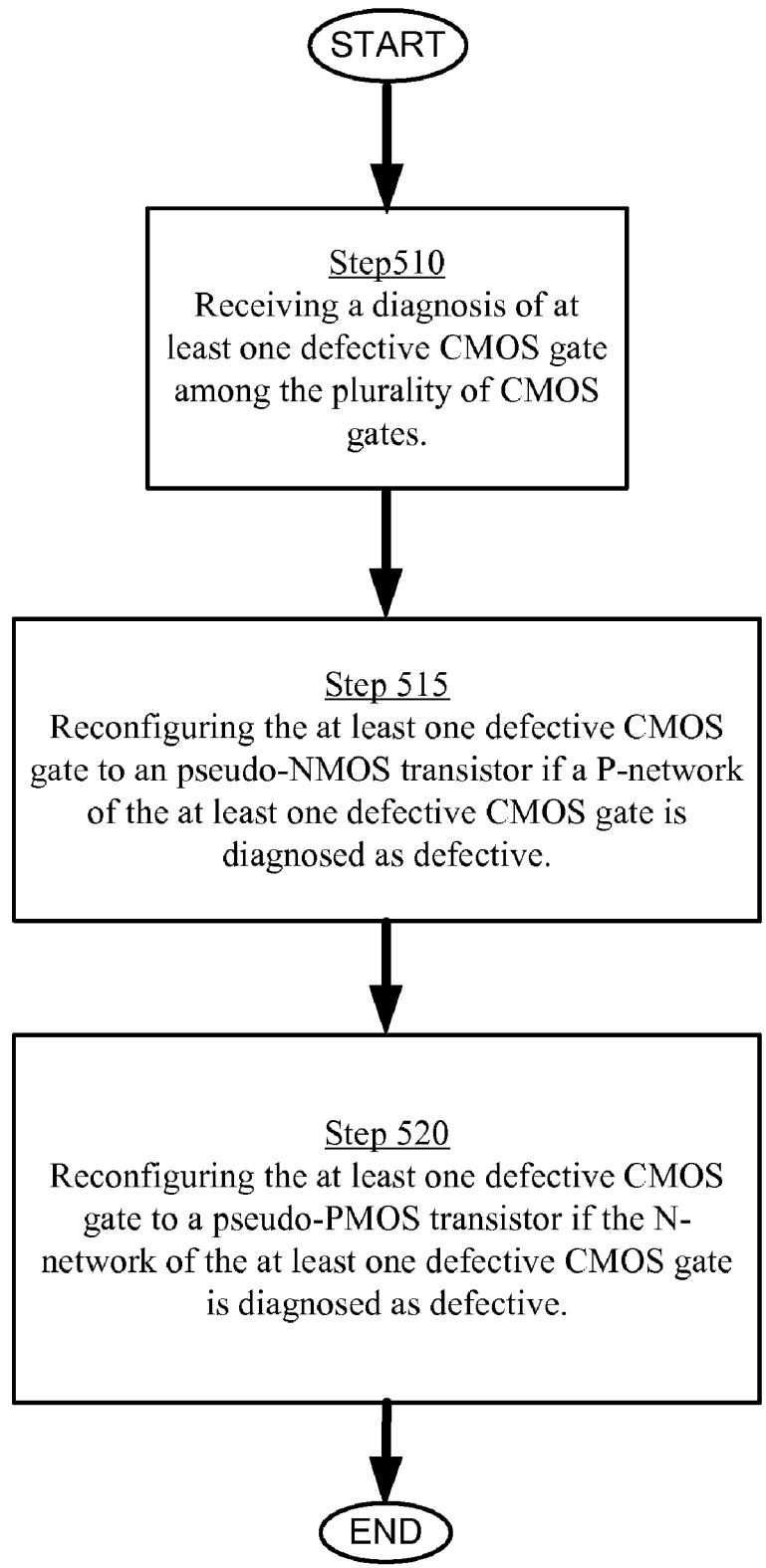
FIG. 5 provides an illustration of a block diagram of the method for correcting a defective logic device 500 in accordance with an exemplary embodiment of the present invention.

FIG. 5 provides an illustration of a block diagram of the method for correcting a defective logic device 500 in accordance with an exemplary embodiment of the present invention. As shown in FIG. 5, the first step of the method for correcting a defective logic device 500 involves receiving a diagnosis of at least one defective CMOS gate among the plurality of CMOS gates. This diagnosis can provide the identity, by location, address, or other information, of one or more defective CMOS gates. The diagnosis can also indicate whether the P-network or the N-network of a particular CMOS gate is defective. Those of skill in the art will appreciate that there are a variety of different ways to diagnose whether defects exist in the plurality of CMOS gates. The exemplary embodiment of the method for correcting a defective logic device 500 depicted in FIG. 5 assumes that a proper diagnosis has been performed on the logic device. Thus, the method for correcting a defective logic device 500 does not necessarily include the step of diagnosis. Additionally, the diagnosis can be received at any point during the operational lifetime of the logic device. For example, and not limitation, the diagnosis could be made immediately after fabrication of the logic device or could be made after an extended period of filed use for the logic device.

The second step 515 of the method for correcting a defective logic device 500 involves reconfiguring the at least one defective CMOS gate to a pseudo-NMOS transistor if a P-network of the at least one defective CMOS gate is diagnosed as defective. Similarly, the third step 520 involves reconfiguring the at least one defective CMOS gate to a pseudo-PMOS transistor if the N-network of the at least one defective CMOS gate is diagnosed as defective.

Execution of these three steps of the exemplary embodiment of the method for correcting a defective logic device 500 enables the correction of one or more defects in the logic device. Therefore, implementing the exemplary embodiment of the method for correcting a defective logic device 500 illustrated in FIG. 5 enables a manufacturer to convert a previously useless and defective logic device into a fully functioning logic device. Thus, the exemplary embodiment method for correcting a defective logic device 500 enables the manufacturer to significantly increase the yield in the fabrication of logic devices. Furthermore, the exemplary embodiment of the method for correcting a defective logic device 500 enables for logic devices that develop defects during field use to be reconfigured and returned to normal operation.

One of the significant benefits of the method for correcting a defective logic device 500 is that the reconfiguration steps can be undone. The ability to reconfigure one of the CMOS gates of the logic device into a pseudo-NMOS or pseudo-PMOS mode and then undo that reconfiguration enables numerous advantages. For example, and not limitation, the method for correcting a defective logic device 500 can be done in an iterative process to ensure that each CMOS gate that is reconfigured is actually defective.

Significantly, this iterative reconfiguration process enables a substantial amount of tolerance to the diagnosis process. It is a difficult task to specifically diagnose which one of the millions of CMOS gates in a logic device is defective. The iterative reconfiguration process enabled by an exemplary embodiment of the method for correcting a defective logic device 500 allows this diagnosis to be less than precise. For example, and not limitation, the diagnosis could pinpoint a group of CMOS gates within the logic device that contain a defective CMOS gate. Therefore, in accordance with an exemplary embodiment of the method for correcting a defective logic device 500, the CMOS gates could be iteratively reconfigured and tested until the defective CMOS gate was located and corrected.

The yield improvement achievable by the systems and methods for providing defect-tolerant logic architectures can be illustrated by the synthesis and evaluation of circuits from the International Symposium on Circuits and Systems ("ISCAS") 1985 benchmark circuits. In an exemplary embodiment, multiple defect-tolerant logic devices can be created, having gates with a transistor channel length of 70 nm, VDD of 1V, and Vt of 0.2V. Furthermore, the defect-tolerant logic devices can utilize a high threshold of 0.3 V for the transistors in the pull-up and pull-down transistors. To analyze the delay overhead and the leakage overhead of various exemplary embodiments of the defect-tolerant logic device, all gates in the ISCAS circuits can be replaced by defect-tolerant counter-parts in accordance with an exemplary embodiment of the present invention. Table 3 shows the delay, leakage power, and dynamic power overhead for various exemplary embodiments of the defect-tolerant logic device, including C432, C1908, C2670, C3540, C5315, C7552, in accordance with the ISCAS benchmarks.

TABLE 3

Average Delay and Power Increase

| | No defect (overhead compared to non-defect-tolerant circuit) | | | 1% defect density (average overhead compared to defect-free circuit) | | |
|---|---|---|---|---|---|---|
| Circuit | Delay | Leakage | Dynamic | Delay | Leakage | Dynamic |
| C432 | 7.8% | 4.7% | 3.4% | 2.6% | 19.7% | 2.7% |
| C1908 | 3.9% | 5.4% | 0.1% | 3.4% | 17.9% | 2.7% |
| C2670 | 7.0% | 4.9% | 2.0% | 1.4% | 17.3% | 2.2% |
| C3540 | 7.1% | 4.3% | 1.9% | 5.9% | 16.8% | 2.6% |
| C5315 | 7.5% | 4.4% | 1.2% | 3.4% | 16.7% | 2.8% |
| C7552 | 8.2% | 4.7% | 1.8% | 2.8% | 17.1% | 2.7% |

The delay and leakage overhead data provided in Table 3 were achieved from data testing the exemplary embodiments with no defects and the exemplary embodiments with a 1% defect density. The data provided in the "No defect" column of Table 3 was calculated by comparing the delay/power of the exemplary embodiments of the defect-tolerant logic devices to conventional circuits (with no defect-tolerant cells). As can been seen by an evaluation of the data provided in Table 3, delay overhead for the exemplary embodiments of the defect-tolerant logic devices increased by an average of around 7%. Furthermore, the leakage and dynamic power of the exemplary embodiment of the defect-tolerant logic devices increased by 4.7% and 1.7% respectively.

Table 3 also shows the delay/power overhead for exemplary embodiments of the defect-tolerant logic device with a 1% defect density. The data is computed by comparing the average of delay/leakage/dynamic power for the exemplary embodiments of the defect-tolerant logic device to defect-free but defect-tolerant devices. Significantly, as shown in Table 3, the delay overhead for the various exemplary embodiments of reconfigured defect-tolerant logic devices is relatively low, below 6%. Furthermore, the leakage overhead for the various exemplary embodiments of reconfigured defect-tolerant logic devices relatively low, below 20%, and the dynamic power overhead is essentially negligible.

Figure 6:
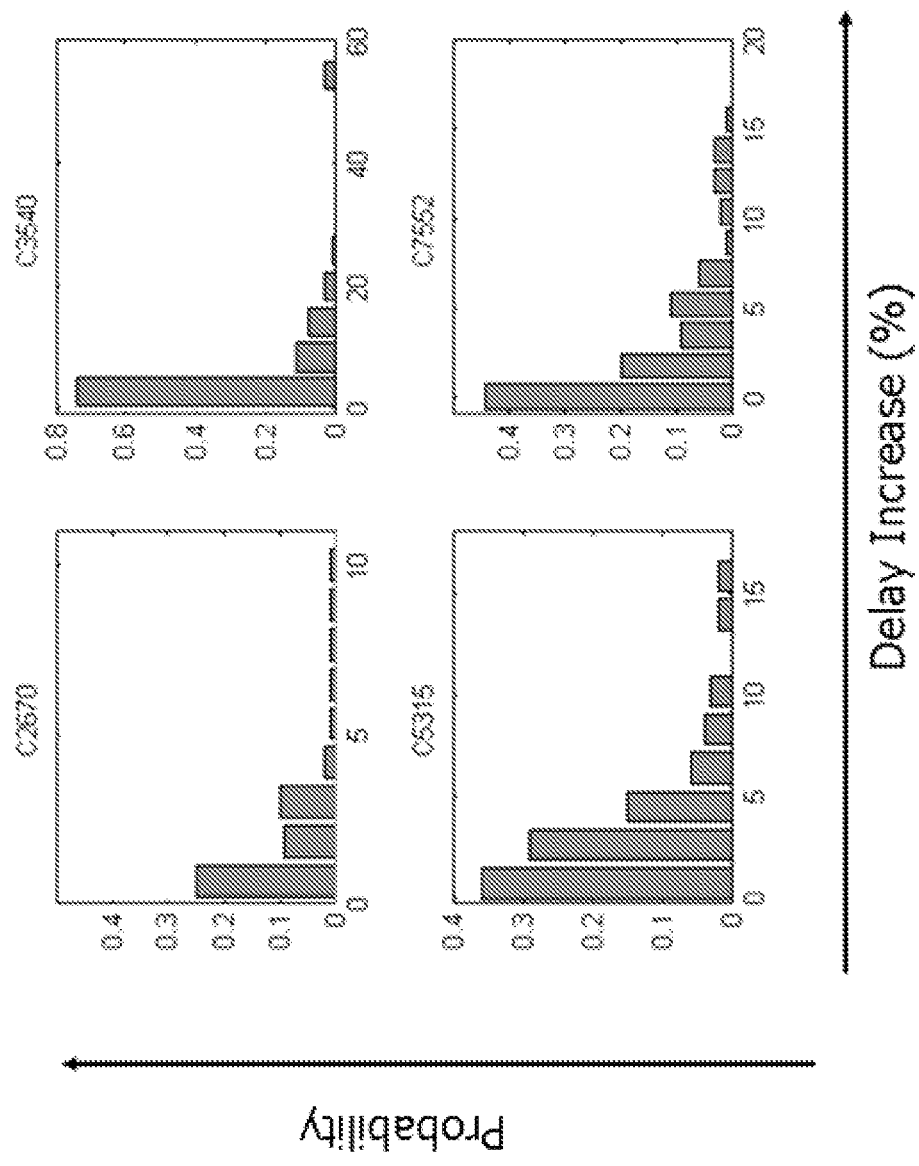
FIG. 6 provides multiple graphs of distribution of delay overhead increases for various exemplary embodiments of the defect-tolerant logic device in accordance with an exemplary embodiment of the present invention.

FIG. 6 provides multiple graphs of distribution of delay overhead increases for various exemplary embodiments of the defect-tolerant logic device in accordance with an exemplary embodiment of the present invention. The four graphs provided in FIG. 6, correspond to four of the exemplary embodiments of defect-tolerant logic devices evaluated in Table 3. The delay overhead distribution graphs provided in FIG. 6 illustrate that most of the exemplary embodiments have a delay overhead increase of less than 5%.

Figure 7:
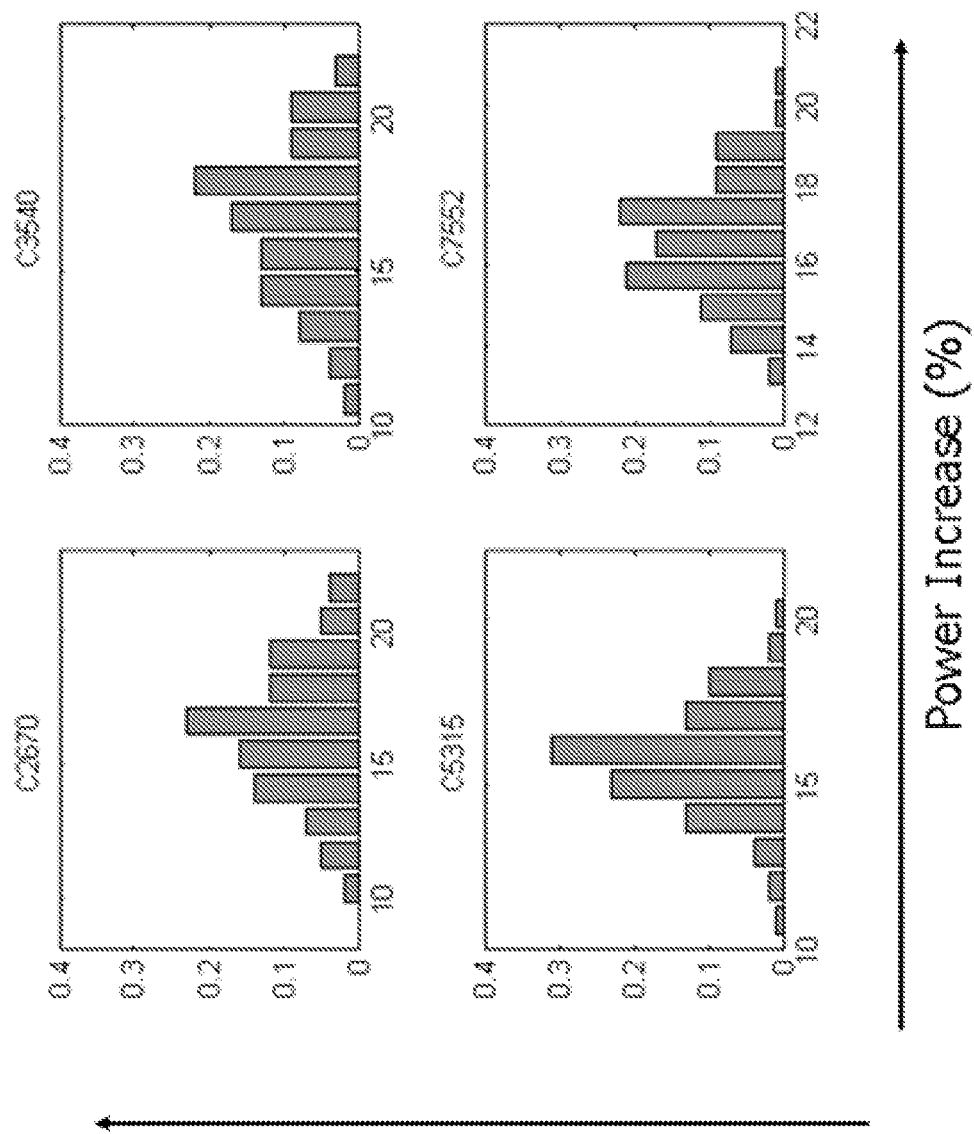
FIG. 7 provides multiple graphs of distribution of leakage overhead increases for various exemplary embodiments of the defect-tolerant logic device in accordance with an exemplary embodiment of the present invention.

FIG. 7 provides multiple graphs of distribution of leakage overhead increases for various exemplary embodiments of the defect-tolerant logic device in accordance with an exemplary embodiment of the present invention. The four graphs provided in FIG. 7, correspond to four of the exemplary embodiments of defect-tolerant logic devices evaluated in Table 3. The leakage overhead distribution graphs provided in FIG. 7 illustrate that most of the exemplary embodiments have a leakage overhead increase of around 15% to 20%.

While the invention has been disclosed in its preferred forms, it will be apparent to those skilled in the art that many modifications, additions, and deletions can be made therein without departing from the spirit and scope of the invention and its equivalents as set forth in the following claims.

What is claimed is:

1. A defect-tolerant logic device comprising:
a plurality of CMOS gates;
at least one defective CMOS gate included within the plurality of CMOS gates;
wherein the at least one defective CMOS gate is enabled to be reconfigured into a pseudo-NMOS transistor if a P-network of the at least one defective CMOS gate is diagnosed as defective; and
wherein the at least one defective CMOS gate is enabled to be reconfigured into a pseudo-PMOS transistor if the N-network of the at least one defective CMOS gate is diagnosed as defective.

2. The defect-tolerant logic device of claim 1, wherein the P-network of the at least one defective CMOS gate is enabled to be reconfigured into a pull-up transistor if the P-network is diagnosed as defective.

3. The defect-tolerant logic device of claim 1, wherein the N-network of the at least one defective CMOS gate is enabled to be reconfigured into a pull-down transistor if the N-network is diagnosed as defective.

4. The defect-tolerant logic device of claim 1, further comprising a plurality of reconfiguration traces in communication with the plurality of CMOS gates.

5. The defect-tolerant logic device of claim 4, wherein the at least one defective CMOS gate further is enabled to receive a reconfiguration control signal transmitted over the plurality of reconfiguration traces.

6. The defect-tolerant logic device of claim 5, wherein the reconfiguration control signal includes data corresponding to the location of the at least one defective CMOS gate.

7. The defect-tolerant logic device of claim 5, wherein the reconfiguration control signal includes data indicating whether the P-network or the N-network of the at least one defective CMOS gate is defective.

8. The defect-tolerant logic device of claim 1, wherein the at least one defective CMOS gate is enabled to be reconfigured from operation as a pseudo-PMOS transistor to normal operation.

9. The defect-tolerant logic device of claim 1, wherein the at least one defective CMOS gate is enabled to be reconfigured from operation as a pseudo-NMOS transistor to normal operation.

10. A method for correcting a defective logic device, the method comprising:
receiving a diagnosis of at least one defective CMOS gate among a plurality of CMOS gates of a logic device;
reconfiguring the at least one defective CMOS gate to a pseudo-NMOS transistor if a P-network of the at least one defective CMOS gate is diagnosed as defective; and
reconfiguring the at least one defective CMOS gate to a pseudo-PMOS transistor if the N-network of the at least one defective CMOS gate is diagnosed as defective.

11. The method for correcting a defective logic device of claim 10, wherein the step of reconfiguring the at least one defective CMOS gate to a pseudo-NMOS transistor includes converting the P-network into a pull-up transistor.

12. The method for correcting a defective logic device of claim 10, wherein the step of reconfiguring the at least one defective CMOS gate to a pseudo-PMOS transistor includes converting the N-network into a pull-down transistor.

13. The method for correcting a defective logic device of claim 10, further comprising the step of providing a plurality of reconfiguration traces in communication with the plurality of CMOS gates.

14. The method for correcting a defective logic device of claim 13, further comprising the steps of transmitting a reconfiguration control signal over the plurality of reconfiguration traces and receiving the reconfiguration control signal at the at least one defective CMOS gate.

15. The method for correcting a defective logic device of claim 14, wherein the reconfiguration control signal includes data corresponding to the location of the at least one defective CMOS gate.

16. The method for correcting a defective logic device of claim 14, wherein the reconfiguration control signal includes data indicating whether the P-network or the N-network of the at least one defective CMOS gate is defective.

17. The method for correcting a defective logic device of claim 10, further comprising the step of reconfiguring the at least one defective CMOS gate from operation as a pseudo-PMOS transistor to normal operation.

18. The method for correcting a defective logic device of claim 10, further comprising the step of reconfiguring the at least one defective CMOS gate from operation as a pseudo-NMOS transistor to normal operation.

19. A method increasing yield in logic device manufacturing, the method comprising:
    fabricating a plurality of logic devices;
    diagnosing at least one defective logic device from the plurality of logic devices;
    diagnosing at least one defective CMOS gate in the at least one defective logic device;
    reconfiguring the at least one defective CMOS gate to an pseudo-NMOS transistor if a P-network of the at least one defective CMOS gate is diagnosed as defective; and
    reconfiguring the at least one defective CMOS gate to a pseudo-PMOS transistor if the N-network of the at least one defective CMOS gate is diagnosed as defective.

20. The method of increasing yield in logic device manufacturing of claim 19, wherein the reconfiguring steps are repeated until the yield reaches an predetermined percentage of the total number of logic devices fabricated.

* * * * *